(12) United States Patent
Li et al.

(10) Patent No.: US 12,200,892 B2
(45) Date of Patent: Jan. 14, 2025

(54) STRUCTURE FOR MOUNTING STORAGE DEVICE AND COMPUTING DEVICE

(71) Applicant: Fulian Precision Electronics (Tianjin) Co., LTD., Tianjin (CN)

(72) Inventors: Han-Yu Li, New Taipei (TW); Wen-Hu Lu, Tianjin (CN); Jun Li, Shenzhen (CN); Chen Xing, Tianjin (CN)

(73) Assignee: Fulian Precision Electronics (Tianjin) Co., LTD., Tianjin (CN)

( * ) Notice: Subject to any disclaimer, the term of this patent is extended or adjusted under 35 U.S.C. 154(b) by 272 days.

(21) Appl. No.: 17/895,468

(22) Filed: Aug. 25, 2022

(65) Prior Publication Data

US 2023/0067530 A1 Mar. 2, 2023

(30) Foreign Application Priority Data

Aug. 30, 2021 (CN) .......................... 202111002669.0

(51) Int. Cl.
*H05K 7/14* (2006.01)
(52) U.S. Cl.
CPC .................................. *H05K 7/1487* (2013.01)
(58) Field of Classification Search
CPC ... H05K 7/1487; H05K 7/1488; H05K 7/1489
See application file for complete search history.

(56) References Cited

U.S. PATENT DOCUMENTS

| | | | | |
|---|---|---|---|---|
| 7,400,936 B2* | 7/2008 | Chang | .................. | G11B 33/022 |
| 8,582,287 B2* | 11/2013 | Nguyen | ............... | G11B 33/124 |
| | | | | 211/126.6 |
| 9,176,546 B2* | 11/2015 | Chen | ........................ | G06F 1/187 |
| 9,703,332 B2* | 7/2017 | Chen | ..................... | G06F 1/1658 |
| 10,212,840 B2* | 2/2019 | Kuan | ..................... | H05K 7/1487 |
| 10,863,644 B1* | 12/2020 | Tseng | ................... | H05K 7/1487 |
| 2011/0289521 A1* | 11/2011 | Chen | ..................... | G11B 33/124 |
| 2021/0251098 A1* | 8/2021 | Gao | ........................ | H05K 7/1417 |
| 2022/0236775 A1* | 7/2022 | Li | ............................ | G06F 1/187 |
| 2022/0377926 A1* | 11/2022 | Wang | ...................... | G06F 1/183 |
| 2023/0133801 A1* | 5/2023 | Liu | ........................ | H05K 7/1487 |
| | | | | 361/679.01 |
| 2023/0328908 A1* | 10/2023 | Tan | ...................... | H05K 5/0221 |
| 2023/0337387 A1* | 10/2023 | Wang | ................... | H05K 7/1489 |

(Continued)

FOREIGN PATENT DOCUMENTS

| | | |
|---|---|---|
| CN | 102681625 | 9/2012 |
| CN | 102804274 B | 7/2015 |
| CN | 205353887 | 6/2016 |

*Primary Examiner* — Daniel J Rohrhoff
(74) *Attorney, Agent, or Firm* — ScienBiziP, P.C.

(57) ABSTRACT

A structure for mounting a storage device to a server and providing a fast installation and removal of a storage device includes a carrier and a chassis. The carrier includes a rotatable handle with a cam on the axis of rotation and a frame. The cam is connected to the frame. The chassis includes an immovable limiting component. With the carrier mounted in the chassis, rotation of the handle clockwise or counterclockwise pushes the carrier to move, to lock or unlock the carrier because of the limiting component resting against the cam. The structure greatly improves the convenience of the installation and removal of the storage device. A computing device is also disclosed.

17 Claims, 5 Drawing Sheets

(56) References Cited

U.S. PATENT DOCUMENTS

2023/0389213 A1\* 11/2023 Shih .................... H05K 7/1487
2024/0032233 A1\* 1/2024 Alvarado ........... H05K 7/20136
2024/0130066 A1\* 4/2024 Lin ........................ G06F 1/185

\* cited by examiner

STRUCTURE FOR MOUNTING STORAGE DEVICE AND COMPUTING DEVICE

FIELD

The subject matter herein generally relates to server construction, to structures for mounting storage device and computing devices.

BACKGROUND

Hard disk drives (HDD) are commonly utilized to store large amounts of data in computer systems. In response to the increasing market demand for larger data storage capacity, more HDDs need to be placed in the limited space of a computing device. It is necessary to be able to easily, quickly, and efficiently remove or install HDDs in a computing device for replacement or maintenance as these services are often required.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure. Moreover, in the drawings, like reference numerals designate corresponding parts throughout the several views.

DETAILED DESCRIPTION

Figure 1:
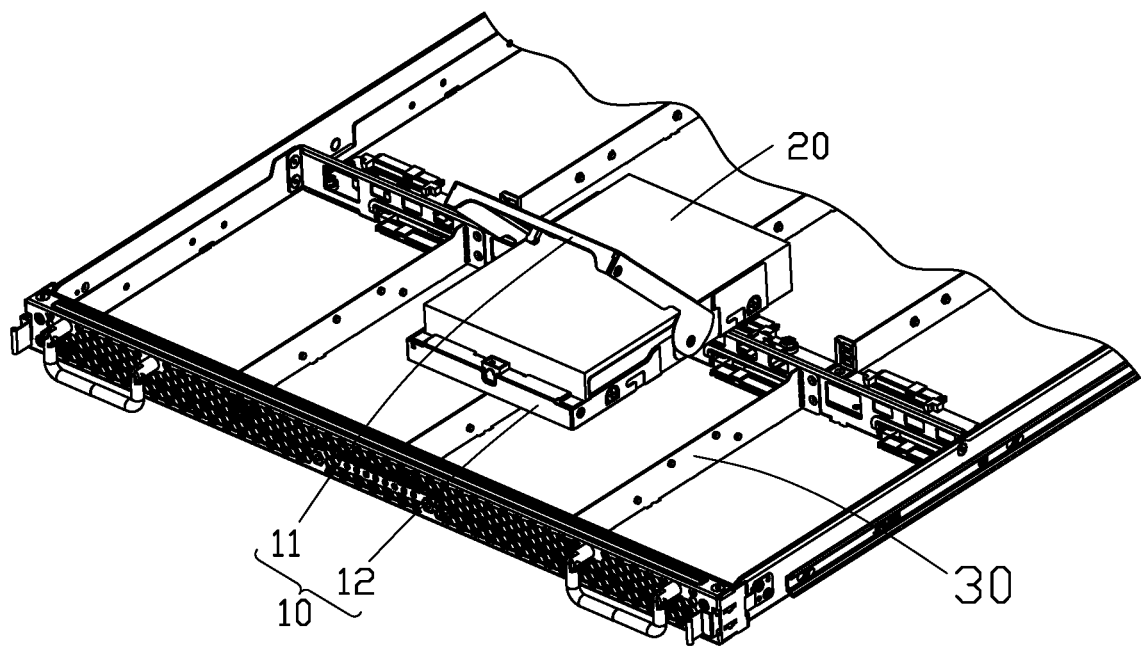
FIG. 1 is an isometric view of a structure for mounting a storage device according to an embodiment of the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

The present disclosure, including the accompanying drawings, is illustrated by way of examples and not by way of limitation. Several definitions that apply throughout this disclosure will now be presented. It should be noted that references to "an" or "one" embodiment in this disclosure are not necessarily to the same embodiment, and such references mean "at least one."

The term "coupled" is defined as connected, whether directly or indirectly through intervening components, and is not necessarily limited to physical connections. The connection can be such that the objects are permanently connected or releasably connected. The term "comprising" means "including, but not necessarily limited to"; it specifically indicates open-ended inclusion or membership in a so-described combination, group, series, and the like.

Without a given definition otherwise, all terms used have the same meaning as commonly understood by those skilled in the art. The terms used herein in the description of the present disclosure are for the purpose of describing specific embodiments only, and are not intended to limit the present disclosure.

As shown in FIG. 1, a structure 100 for mounting storage device to mount a storage device such as Hard Disk Drive (HDD 20) in a computing device of an embodiment includes a carrier 10 and a chassis 30. The carrier 10 holds and carries the HDD 20. The chassis 30 has a connector to electrically connect the HDD 20. The carrier 10 can be assembled or disassembled to the chassis 30 and so connect or disconnect the HDD 20.

Figure 2:
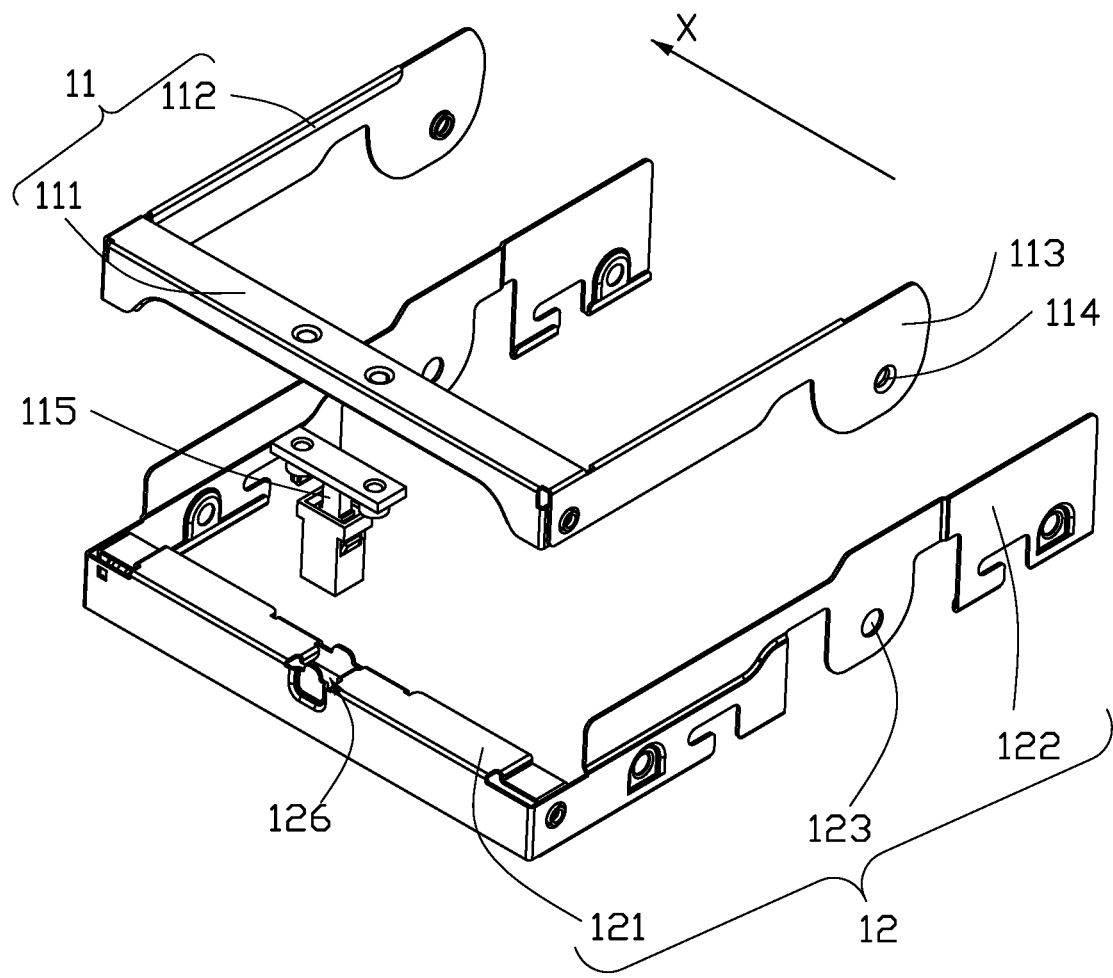
FIG. 2 is an isometric view of a handle and a frame of the structure according to an embodiment of the present disclosure.
Figure 3:
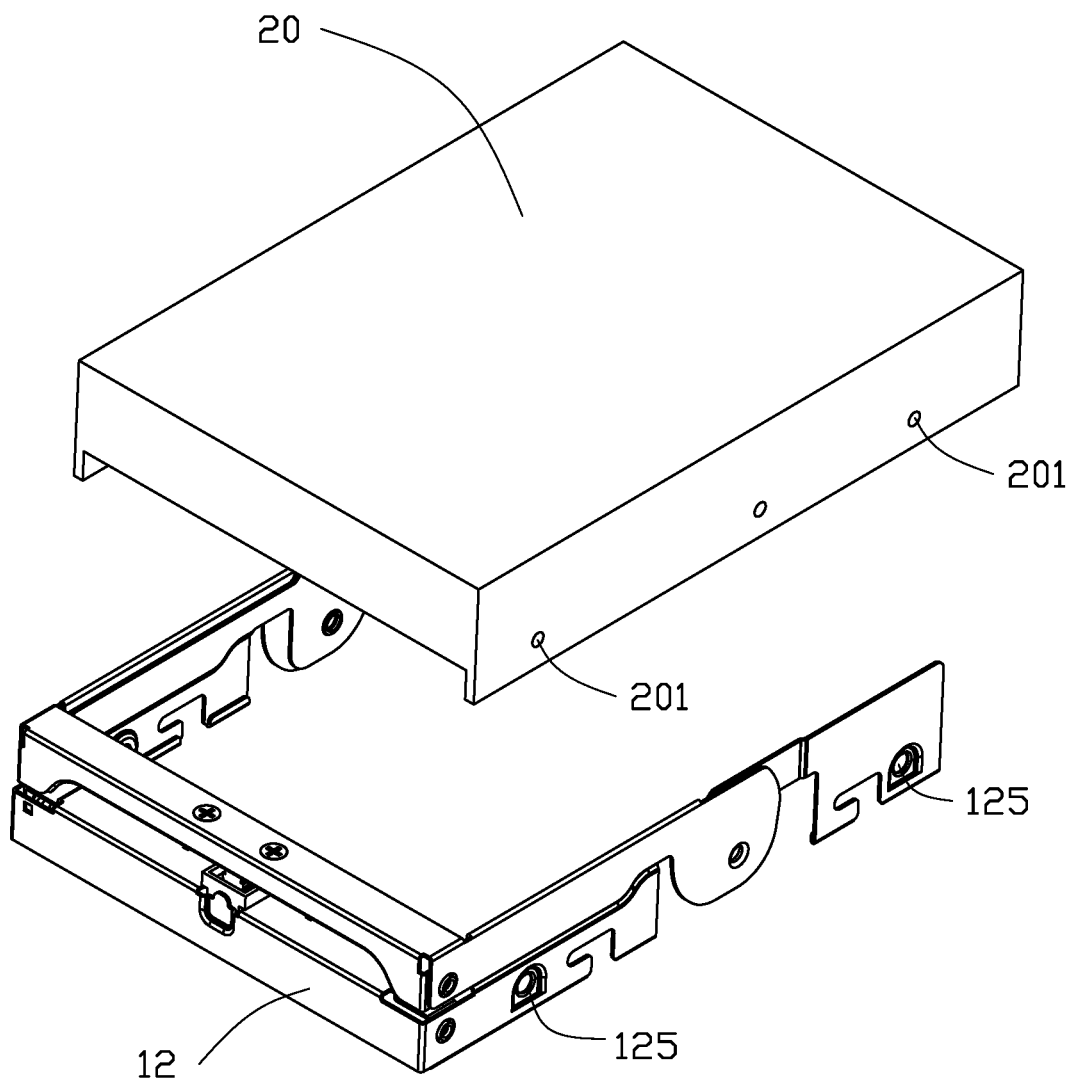
FIG. 3 is an isometric view of a carrier and a HDD of the structure according to an embodiment of the present disclosure.

As shown in FIG. 2 and FIG. 3, the carrier 10 includes a handle 11 and a frame 12. The handle 11 is rotatable on the frame 12. The handle 11 includes a handlebar 111 and two linkages 112. The two linkages 112 are located on either side of the handlebar 111, the handle 11 is U-shaped. Each of the linkages 111 has a cam 113. The cam 113 is located on the end of the linkage 112 away from the handlebar 111.

The frame 12 includes a middle part 121 and two side parts 122. The two side parts 122 are located on either side of the middle part 121, the frame 12 is U-shaped. Each cam 113 is connected to one side part 122, and the cam 113 is rotatable on the side part 122 along the axis of the cam 113. The direction of the axis of the cam 113 is along direction X. The handle 11 is rotatable relative to the frame 12 along the direction X.

Figure 4:
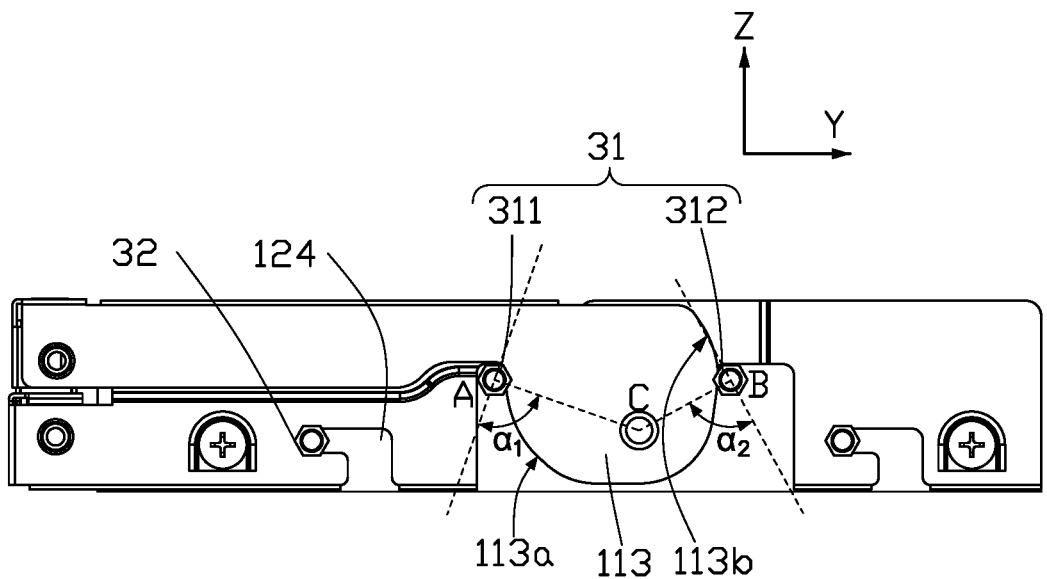
FIG. 4 is a side view of the carrier according to an embodiment of the present disclosure.

As shown in FIG. 4, the chassis 30 includes two limiting components 31. Two limiting components 31 are each close to one cam 113. Each limiting component 31 includes a first pin 311 and a second pin 312. The first pin 311 and the second pin 312 are located on either side of the cam 113 along direction Y. The direction Y is substantially perpendicular to the direction X. The cam 113 includes a first curved surface 113a and a second curved surface 113b. The first pin 311 rests against the first curved surface 113a when the cam 113 is rotated counterclockwise. The shape of the first curved surface 113a is such that the first pin 311 pushes the cam 113 during the rotation, which moves the carrier 10 forward to connect the HDD 20 with the connector. Similarly, the second pin 312 rests against the second curved surface 113b when the cam 113 rotates clockwise. The shape of the second curved surface 113b is such that the second pin 312 pushes the cam 113 during the rotation, which moves the carrier 10 backward to disconnect the HDD 20 from the connector.

Figure 5:
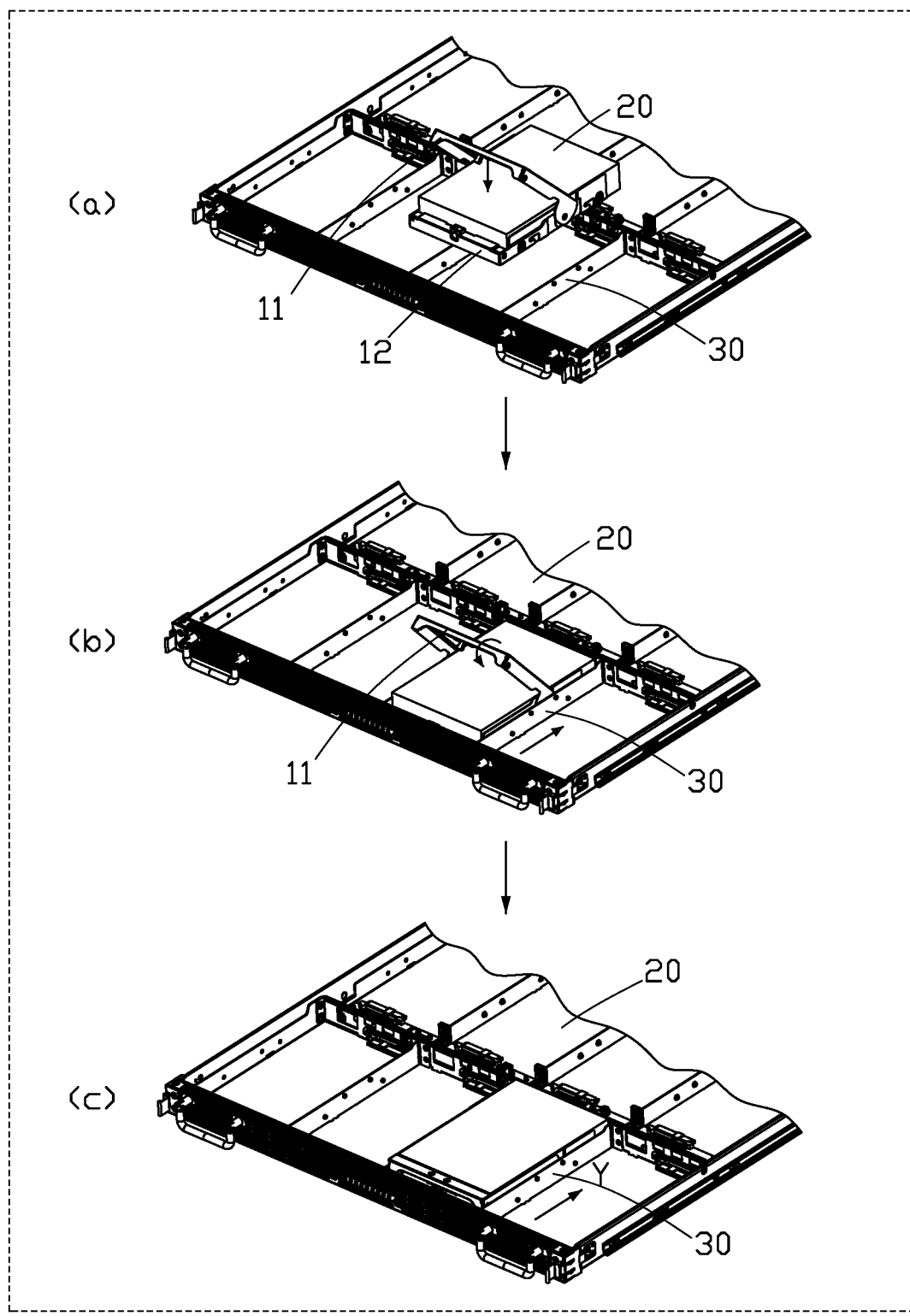
FIG. 5 is an isometric view of the structure with storage device according to an embodiment of the present disclosure.

As shown in FIG. 5 from (a) to (c), installation of the HDD 20 into the chassis 30, requires rotation of the handle 11 up and the carrier 10 being put in the chassis 30, and then the handle 11 is rotated down to connect the HDD 20 with the connector. Removal of the HDD 20 from the chassis 30, requires rotation upwards of the handle 11 to disconnect the HDD 20 from the connector, and then pull out the carrier 10 from the chassis 30. The structure 100 greatly improves the ease and convenience of the installation and removal of the HDD 20.

As shown in FIG. 4, a first contact point A is defined between the first curved surface 113a and the first pin 311. A second contact point B is defined between the second curved surface 113b and the second pin 312. A first line AC connecting the axis of the cam 113 and the first contact point A is defined. A second line BC connecting the axis of the cam 113 and the second contact point B is defined. The first angle α1 is defined between the first line AC and the tangent of the first contact point A on the first curved surface 113a. The second angle α2 is defined between the second line BC and the tangent of the second contact point B on the second curved surface 113b. The first angle α1 and the second angle α2 are both substantially at 90 degrees when at rest (that is, when the handle 11 is rotated down and closed) but are less than 90 degrees when the cam 113 is being rotated, to allow the first pin 311 to push the first curved surface 113a to move forward and to allow the second pin 312 push the second curved surface 113b to move backward, which makes the carrier 10 and the HDD 20 move simultaneously along the direction Y.

As shown in FIG. 4, in some embodiments, when the HDD 20 is connected to the connector (which means that the carrier 10 is locked down), the first angle α1 and the second angle α2 are equal 90 degrees, improving the stability of the carrier 10, which allows the handle 11 to rotate a small amount in an unexpected situation such as shaking or vibration without moving significantly along the direction Y.

As shown in FIG. 4, in some embodiments, the length of the first curved surface 113a is greater than the length of the second curved surface 113b, which allows the HDD 20 move forward smoothly and move backward quickly, to improve the speed of connecting of the HDD 20 and the connector and to save time in removal.

As shown in FIG. 4, in some embodiments, the side part 122 has at least one groove 124. The chassis 30 further includes at least one positioning pin 32. The groove 124 is L-shaped and one end runs through the bottom of the side part 122. When the carrier 10 is mounted in the chassis 30, the positioning pin 32 automatically inserts itself into the groove 124 at the open end of the groove 124, and the positioning pin 32 is movable along the direction Y in the groove 124. When the carrier 10 is locked, the positioning pin 32 moves to other end of the groove 124 to limit the position of the carrier 10 along a direction Z. The direction Z is substantially perpendicular to the direction Y and the direction X.

As shown in FIG. 3, in some embodiments, the side part 122 has at least one hole 125. The HDD 20 also has at least one hole 201. Holes 125 and holes 201 correspond one-to-one for using screws to fix the HDD 20 to the carrier 10.

As shown in FIG. 2, in some embodiments, the side part 122 has a first axis-hole 123. The cam 113 has a second axis-hole 114. The first axis-hole 123 is aligned with the second axis-hole 114. The handle 11 further includes two shafts. Each shaft is inserted in the first axis-hole 123 and the second axis-hole 114. The shaft is connected to the side part 122, to allow the handle 11 to rotate relative to the frame 12.

As shown in FIG. 2, in some embodiments, the middle part 121 has a slot 126, and the handlebar 111 has a buckle 115. The buckle 115 is inserted into the slot 126 to lock the handle 11. In some other embodiments, the middle part 121 has a buckle 115, and the handlebar 111 has a slot 126.

A computing device of an embodiment includes a plurality of storage devices (each one a HDD 20) and a plurality of structure 100. Each structure 100 is used for connecting or disconnecting a HDD 20 to the computing device.

In another embodiment, the handle 11 is located on the chassis 30 and the limiting component 31 is located on the frame 12, giving the same effect as moving the HDD 20 by turning the handle 11. Specifically, the carrier 10 only includes the frame 12. The limiting component 31 (the first pin 311 and the second pin 312) is located on the side part 122. The handle 11 is located on the chassis 30. The handle 11 is rotatable on the chassis 30 along the axis of the cam 113.

Also, when the carrier 10 is mounted in the chassis 30 and when the handle 11 is being rotated, the cam 113 can still rest against the limiting component 31 (the first pin 311 or the second pin 312) to push the carrier 10 to move along a direction Y to connect or disconnect the HDD 20 to the connector.

However, the differences are that the first angle α1 and the second angle α2 are greater than 90 degrees when the cam 113 is being rotated. The length of the first curved surface 113a is less than the length of the second curved surface 113b, since the second curved surface 113b is used for pushing the second pin 312 to move forward and the first curved surface 113a is used for pushing the first pin 311 to move backward.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure up to, and including the full extent established by the broad general meaning of the terms used in the claims.

What is claimed is:
1. A structure for mounting storage device comprising:
a carrier; and
a chassis; wherein
the carrier comprises a handle and a frame, the handle comprises a handlebar and two linkages, the two linkages are located on either side of the handlebar, each of the linkages has a cam, the cam is located on the end of the linkage away from the handlebar;
the frame comprises a middle part and two side parts, the two side parts are located on either side of the middle part, each of the cams is connected to one side part, the handle is rotatable relative to the frame along an axis of the cam;
the chassis comprises a limiting component;
when the carrier is mounted in the chassis and when the handle is being rotated, the limiting component rests against the cam to push the carrier to move along a direction Y to lock or unlock a position of the carrier; wherein
the direction Y is substantially perpendicular to the axis of the cam;
the limiting component comprises a first pin and a second pin, the first pin and the second pin are located on either side of the cam along the direction Y, the cam comprises a first curved surface and a second curved surface, the first pin rests against the first curved surface when the cam rotates clockwise to lock the carrier, and the second pin rests against the second curved surface when the cam rotates counterclockwise to unlock the carrier.

2. The structure for mounting storage device of claim 1, wherein:
- a first contact point is defined between the first curved surface and the first pin, a second contact point is defined between the second curved surface and the second pin;
- a first line connecting the axis of the cam and the first contact point is defined, a second line connecting the axis of the cam and the second contact point is defined;
- a first angle is defined between the tangent of the first contact point and the first line, a second angle is defined between the tangent of the second contact point and the second line, wherein
- the first angle and the second angle are less than 90 degrees when the cam is being rotated.

3. The structure for mounting storage device of claim 2, wherein:
- when the carrier is locked, the first angle and the second angle are equal to 90 degrees.

4. The structure for mounting storage device of claim 1, wherein:
- the side part has at least one groove, the chassis further comprises at least one positioning pin, the groove is L-shaped;
- when the carrier is mounted in the chassis, the positioning pin is inserted into the groove by one end of the groove, and the positioning pin is movable along the direction Y to limit the position of the carrier along a direction Z;
- the direction Z is substantially perpendicular to the direction Y and the axis of the cam.

5. The structure for mounting storage device of claim 1, wherein:
- the side part comprises at least one hole configured to install a storage device with a screw.

6. The structure for mounting storage device of claim 1, wherein:
- the handle further comprises two shafts, each of the shafts is located on the axis of the cam coaxially, and the shafts are connected to the side parts, the handle is rotatable relative to the frame.

7. The structure for mounting storage device of claim 1, wherein:
- the middle part defines a slot, the handlebar comprises a buckle, the buckle is inserted into the slot to lock the handle.

8. The structure for mounting storage device of claim 1, wherein:
- a length of the first curved surface is greater than a length of the second curved surface.

9. A structure configured for mounting a storage device comprising:
- a carrier; and
- a chassis; wherein
- the carrier comprises a frame, the frame comprises a middle part and two side parts, the two side parts are located on either side of the middle part, each side part comprises a limiting component, the limiting component is located on the end of the side part away from the middle part;
- the chassis comprises a handle, the handle comprises a handlebar and two linkages, the two linkages are located on either side of the handlebar, each of the linkages comprises a cam, the cam is located on the end of the linkage away from the handlebar, the handle is rotatable along the along an axis of the cam;
- when the carrier is mounted in the chassis and when the handle is being rotated, the cam rests against the limiting component to push the carrier to move along a direction Y to lock or unlock a position of the carrier; wherein
- the direction Y is substantially perpendicular to the axis of the cam;
- the limiting component comprises a first pin and a second pin, the first pin and the second pin are located on either side of the cam along the direction Y, the cam comprises a first curved surface and a second curved surface, the first pin rests against the first curved surface when the cam rotates clockwise to lock the carrier, and the second pin rests against the second curved surface when the cam rotates counterclockwise to unlock the carrier.

10. The structure configured for mounting a storage device of claim 9, wherein:
- a first contact point is defined between the first curved surface and the first pin, a second contact point is defined between the second curved surface and the second pin;
- a first line connecting the axis of the cam and the first contact point is defined, a second line connecting the axis of the cam and the second contact point is defined;
- a first angle is defined between the tangent of the first contact point and the first line, a second angle is defined between the tangent of the second contact point and the second line, wherein
- the first angle and the second angle are greater than 90 degrees when the cam is being rotated.

11. The structure configured for mounting a storage device of claim 10, wherein:
- when the carrier is locked, the first angle and the second angle are equal to 90 degrees.

12. The structure configured for mounting a storage device of claim 9, wherein:
- a length of the first curved surface is less than a length of the second curved surface.

13. A computing device comprising:
- a plurality of storage devices; and
- a plurality of structure for mounting storage devices; wherein each structure for mounting storage device comprises:
- a carrier to hold one storage device; and
- a chassis to hold the carrier; wherein
- the carrier comprises a handle and a frame, the handle comprises a handlebar and two linkages, the two linkages are located on either side of the handlebar, each of the linkages has a cam, the cam is located on the end of the linkage away from the handlebar;
- the frame comprises a middle part and two side parts, the two side parts are located on either side of the middle part, the two side parts are connected to either side of the storage device, each of the cams is connected to one side part, the handle is rotatable relative to the frame along an axis of the cam;
- the chassis comprises a limiting component;
- when the carrier is mounted in the chassis and the handle is rotated, the limiting component rests against the cam to push the carrier to move along a direction Y to lock or unlock a position of the carrier; wherein
- the direction Y is substantially perpendicular to the axis of the cam;
- the limiting component comprises a first pin and a second pin, the first pin and the second pin are located on either side of the cam along the direction Y, the cam comprises a first curved surface and a second curved surface, the first pin rests against the first curved surface when the cam rotates clockwise to lock the carrier, and the second pin rests against the second curved surface when the cam rotates counterclockwise to unlock the carrier.

14. The computing device of claim 13, wherein:
a first contact point is defined between the first curved surface and the first pin, a second contact point is defined between the second curved surface and the second pin;
a first line connecting the axis of the cam and the first contact point is defined, a second line connecting the axis of the cam and the second contact point is defined;
a first angle is defined between the tangent of the first contact point and the first line, a second angle is defined between the tangent of the second contact point and the second line, wherein
the first angle and the second angle are less than 90 degrees when the cam is being rotated.

15. The computing device of claim 14, wherein:
when the carrier is locked, the first angle and the second angle are equal to 90 degrees.

16. The computing device of claim 13, wherein:
a length of the first curved surface is greater than a length of the second curved surface.

17. The computing device of claim 13, wherein:
the side part comprises at least one groove, the chassis further comprises at least one positioning pin, the groove is L-shaped;
when the carrier is mounted in the chassis, the positioning pin is inserted into the groove by one end of the groove, and the positioning pin is movable along the direction Y to limit the position of the carrier along a direction Z;
the direction Z is substantially perpendicular to the direction Y and the axis of the cam.

* * * * *